United States Patent [19]

Ogata et al.

[11] Patent Number: 5,250,327
[45] Date of Patent: Oct. 5, 1993

[54] COMPOSITE SUBSTRATE AND PROCESS FOR PRODUCING THE SAME

[75] Inventors: Kiyoshi Ogata; Yasunori Ando; Eiji Kamijo, all of Kyoto, Japan

[73] Assignee: Nissin Electric Co. Ltd., Kyoto, Japan

[21] Appl. No.: 390,001

[22] Filed: Aug. 7, 1989

Related U.S. Application Data

[63] Continuation of Ser. No. 43,518, Apr. 28, 1987, abandoned.

[30] Foreign Application Priority Data

Apr. 28, 1986 [JP] Japan .................. 61-98886

[51] Int. Cl.⁵ .................. B05D 3/06; B05D 5/12; C23C 14/00
[52] U.S. Cl. .................. 427/528; 427/530; 427/531; 427/124; 427/126.1; 204/192.11; 204/192.15
[58] Field of Search .................. 427/38, 39, 124, 123, 427/126.1, 126.2, 126.4, 528, 530, 531; 204/192.11, 192.31, 192.15

[56] References Cited

U.S. PATENT DOCUMENTS

| | | | |
|---|---|---|---|
| 3,915,757 | 10/1975 | Engel | 427/38 |
| 3,925,187 | 12/1975 | Bernard | 427/38 |
| 4,105,443 | 8/1978 | Dearnaley et al. | 427/38 |
| 4,297,387 | 10/1981 | Beale | 427/38 |
| 4,364,969 | 12/1982 | Dearnaley et al. | 427/38 |
| 4,412,899 | 11/1983 | Beale | 427/38 |
| 4,415,420 | 11/1983 | Beale | 427/38 |
| 4,490,229 | 12/1984 | Mirtich et al. | 204/192.11 |
| 4,520,040 | 5/1985 | Cordts | 427/38 |
| 4,591,417 | 5/1986 | Kaiser et al. | 427/38 |
| 4,645,115 | 2/1987 | Kamigaito et al. | 427/38 |
| 4,673,587 | 6/1987 | Kamigaito et al. | 427/38 |
| 4,683,149 | 7/1987 | Suzuki et al. | 204/192.31 |
| 4,698,233 | 10/1987 | Ohira et al. | 427/38 |
| 4,718,905 | 1/1988 | Freeman | 427/2 |
| 4,724,156 | 2/1988 | Arai et al. | 427/38 |
| 4,759,948 | 7/1988 | Hashimoto et al. | 427/38 |
| 4,822,466 | 4/1989 | Rabalais et al. | 204/192.31 |
| 4,828,870 | 5/1989 | Ando et al. | 427/38 |

Primary Examiner—Marianne Padgett
Attorney, Agent, or Firm—Sughrue, Mion, Zinn, Macpeak & Seas

[57] ABSTRACT

A composite substrate comprises a metal substrate, an electrically insulating ceramic layer formed on the metal substrate, a metal layer formed on the ceramic layer, a first mixed layer formed in an area near the interface between the metal substrate and the ceramic layer, and a second mixed layer formed in an area near the interface between the ceramic layer and the metal layer, each of the mixed layers being composed of the materials of the layers situated on both sides thereof. The composite substrate may comprise a plurality of electrically insulating dissimilar ceramic layers between the metal substrate and the metal layer, and a mixed layer formed in an area near the interface between any two of the adjacent ceramic layers.

10 Claims, 1 Drawing Sheet

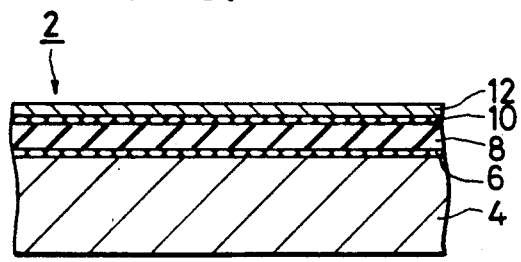
FIG. 1
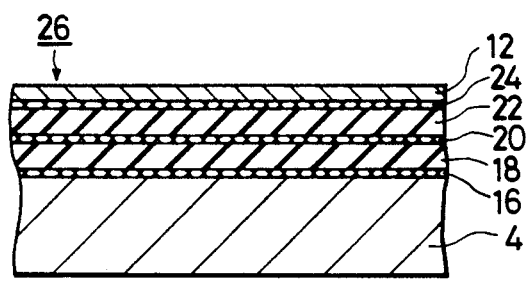
FIG. 2
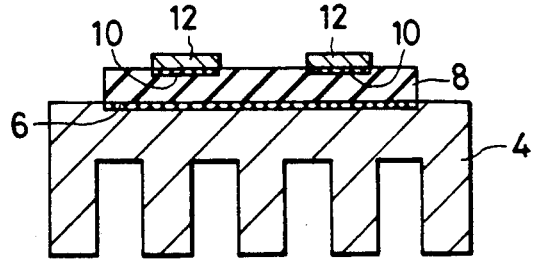
FIG. 3
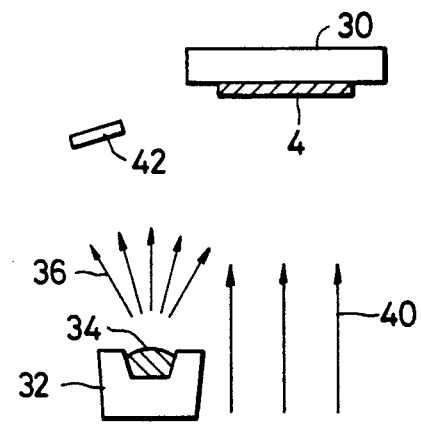
FIG. 4
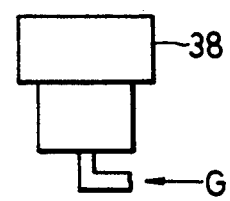

COMPOSITE SUBSTRATE AND PROCESS FOR PRODUCING THE SAME

This is a continuation of application Ser. No. 07/043,518 filed Apr. 28, 1987 now abandoned.

BACKGROUND OF THE INVENTION

The present invention relates to a composite substrate for use as a package or various other substrates for electronic devices such as ICs and semiconductor devices. The present invention also relates to a process for producing such a composite substrate.

Recent advances in the technology of electronic devices such as ICs and semiconductor devices are remarkable and active efforts are being made to reduce the size of such electronic devices while increasing their packing density. One of the problems that accompany these efforts is how to effectively dissipate the heat generated in devices. Conventionally, alumina ($Al_2O_3$) packages or substrates have been used with micro-electronic devices but in order to achieve more efficient heat dissipation, various new types of substrates have been proposed and reviewed. Among them are: (1) a ceramic substrate made of a material having good heat conductivity such as BeO, AlN or SiC; (2) and enamelled substrate consisting of an iron sheet with an enamel coating; (3) a metal substrate to which an insulator is bonded with an adhesive; (4) a metal substrate on which a ceramic powder is flame-sprayed; (5) a metal substrate on which a thin ceramic film is formed by a suitable method such as physical vapor deposition (PVD) or chemical vapor deposition (CVD); and (6) a metal substrate on the surface of which an insulating organic polymer layer is formed. However, these substrates have their own problems described below and are not completely satisfactory for use in practical applications.

(1) A ceramic substrate made of a good heat conductor such as BeO, AlN or SiC conducts 5-20 times as much heat as an alumina substrate but its manufacture requires a complicated process comprising purification of the starting powder, controlling the particle size of the powder, shaping the powder into a compact and sintering the compact. In addition, the need for performing sintering at elevated temperatures (1500°-2000° C.) involves such disadvantages as difficulty in preparing a substrate of large surface area, development of thermal distortion and high cost. Of the three material mentioned above, BeO has the highest heat conductivity but because of its toxic nature and high cost it can be used in only a very limited area.

(2) The manufacture of an enamelled substrate involves fusing enamel frit in the high temperature range of 650°-800° C., so that the resulting enamel layer as an insulator has a minimum thickness of 0.5 mm and reduces the heat conductivity of the substrate. A thin ($\leq 0.1$ mm) enamel coat contains so many pinholes in its surface that its insulation withstand voltage will fall to a commercially unacceptable level.

(3) A metal substrate to which an insulator such as alumina is bonded with an adhesive has not yet been commercialized for several reason such as an increased resistance to heat conduction in the adhesive layer and unevenness in the adhesive strength of various parts of the substrate.

(4) A metal substrate on which a ceramic powder is thermal-sprayed contains so many pinholes in the sprayed insulation layer that it does not have sufficient insulation withstand voltage or the desired surface flatness of insulation layer.

(5) A metal substrate on which a thin ceramic film is formed by a suitable method such as PVD or CVD requires heating at 500° C. or higher in order to form the thin ceramic film and this causes such disadvantages as a decreased freedom in the choice of a suitable metal substrate and a reduction in the strength of the substrate. In addition, the adhesion between the thin ceramic film and the metal substrate is not strong and a great amount of unevenness is introduced in the film quality.

(6) A substrate having a thin organic polymer layer is also disadvantageous in that polymers have poor heat resistance and are not highly heat-conductive to serve as an efficient heat dissipater.

Metal layers that establish connection to the device or provide an inter connecting circuit are usually formed on the insulator (or insulating layer) of each of the substrates described above. Conventionally, these metal layers are formed by techniques such as bonding with an adhesive, a thick-film process, PVD and CVD. A problem common to these techniques is that the metal layer does not adhere strongly to the insulation layer and separation between the two layers may readily occur if thermal stress is produced by for example, the soldering of lead wires. If one wants to provide stronger adhesion between the metal layer and the insulating layer, precise process control must be performed but then this results in high manufacturing cost.

SUMMARY OF THE INVENTION

An object, therefore, of the present invention is to provide a highly economical composite substrate that has good characteristic such as high electrical insulation, heat conductivity and reliability and the topmost metal layer of which adheres strongly to an underlying layer and will not easily separate from the latter.

Another object of the present invention is to provide a process for producing such an improved composite substrate.

BRIEF DESCRIPTION OF THE DRAWINGS

FIG. 1 is a partial enlarged cross sectional view of a composite substrate according to one embodiment of the present invention;

FIG. 2 is a partial enlarged cross sectional view of a composite substrate according to another embodiment of the present invention;

FIG. 3 is a diagrammatic cross-sectional view of an application of the composite substrate shown in FIG. 1; and FIG. 4 is a sketch of an apparatus that is used to produce a composite substrate by the process of the present invention.

DESCRIPTION OF THE PREFERRED EMBODIMENTS

FIG. 1 is a partial enlarged cross sectional view of a composite substrate according to one embodiment of the present invention. The composite substrate generally indicated by 2 consists of a metal substrate 4 that is overlaid with an electrically insulating ceramic layer 8 which in turn is overlaid with a metal layer 12, with a mixed layer 6 being formed in an area near the interface between the metal substrate 4 and the ceramic layer 8 while another mixed layer 10 is formed in an area near the interface between the ceramic layer 8 and the metal layer 12. Each of the mixed layers 6 and 10 is composed of the materials of the layers situated on both sides thereof. Therefore, the mixed layer 10 is a composite layer in which both an insulator and a metal are present.

The material of the metal substrate 4 is preferably selected from among those which have high heat conductivities and the thermal expansion coefficients of which are close to that of a device of interest. Useful materials are Al, Al alloys, Cu, Cu alloys, stainless steel, Fi-42Ni, and Kovar. The choice of the shape of the metal substrate 4 is made on the basis of such factors as the use of the composite substrate to be finally produced; the substrate 4 may assume the shape of a package, a variety of substrate forms, a heat sink or any other appropriate shape.

The material of the ceramic layer 8 is preferably selected from among those which have good heat conducting and electrically insulating properties, low dielectric constants and the thermal expansion coefficients of which are close to that of a device which is to be mounted on the finally produced composite substrate. Useful materials include cubic boron nitride (C-BN), boron nitride (BN) containing cubic BN, aluminum nitride (AlN), boron phosphide (BP), diamond, and diamond-like carbon. The ceramic layer 8 and the mixed layer 6 may be formed either on the entire surface of the metal substrate 4 or in a selected area of the substrate 4.

The material of the metal layer 12 is preferably selected from among those which have high electrical conductivity such as W, Mo, Ni, Cu, Al, Au, Ag and various alloys thereof. The metal layer 12 may be formed on the entire surface of the ceramic layer 8; alternatively, the metal layer 12 may be patterned in a predetermined circuit so that it can be used in providing interconnections or for attaining other purposes. The metal later 12 formed on the entire surface of the ceramic layer 8 may be patterned, as required, by a suitable known method. A device of interest may be mounted on the metal layer 12 by a suitable known method in consideration of such factors as the use of the composite substrate.

The composite substrate 2 described above has the following features.

(1) It comprises a metal substrate 4 having high heat conductivity to which a ceramic layer 8 having good heat conducting and electrically insulating properties adheres strongly. Therefore, the composite substrate 2 exhibits good electrical insulation and heat conduction.

(2) No adhesive is used between the metal substrate 4 and the ceramic layer 8 or between the ceramic layer 8 and the metal layer 12. Because of the presence of two mixed layers 6 and 10, both the interface between the metal substrate 4 and the ceramic layer 8 and the interface between the ceramic layer 8 and the metal layer 12 have a continuously varying composition. As a result, very good heat conduction is assured both between the metal substrate 4 and the ceramic layer 8 and between the ceramic layer 8 and the metal layer 12.

(3) The mixing layers 6 and 10 act as if they were wedges and provide good adhesion both between the metal substrate 4 and the ceramic layer 8 and between the ceramic layer 8 and the metal layer 12 so that neither the ceramic layer 8 nor the metal layer 12 will easily separate from the metal substrate 4. In addition, any thermal expansion mismatch that exists either between the metal substrate 4 and the ceramic layer 8 or between the ceramic layer 8 and the metal layer 12 will be effectively absorbed by the mixed layer 6 or 10, respectively, having continuously varying compositions to prevent the occurrence of cracking. As a result, the composite substrate 2 has high reliability.

(4) The thickness of the ceramic layer 8 on the metal substrate 4 can be sufficiently decreased to ensure even better heat conduction between the metal substrate 4 and the device mounted on the metal layer 12.

(5) Compared with a ceramic substrate used alone, the composite substrate 2 has a large surface area and can be produced in an easy and economical manner.

FIG. 2 is a partial enlarged cross sectional view of a composite substrate according to another embodiment of the present invention. The composite substrate of this embodiment is hereunder described with emphasis being placed on the differences from the substrate 2 shown in FIG. 1.

The composite substrate of this second embodiment which is generally indicated by 26 has a plurality (two in the embodiment under discussion) of dissimilar ceramic layers 18 and 22 as electrical insulators formed on a metal substrate 4. A metal layer 12 is formed on the upper ceramic layer 22. A mixed layer 16 is formed in an area near the interface between the metal substrate 4 and the overlying ceramic layer 18; another mixed layer 20 is formed in an area near the interface between the two ceramic layers 18 and 22; and a third mixed layer 24 is formed in an area near the interface between the upper ceramic layer 22 and the metal layer 12. Each of these mixing layers 16, 20 and 24 is composed of the materials of the layer situated on both sides thereof. Therefore, the mixed layer 24 is a composite layer in which both an insulator and a metal are present as in the case of the mixing layer 10 formed in composite substrate of the first embodiment.

The choice of the material of each of the metal substrate 4, ceramic layers 18 and 22 and the metal layer 12 may be made in accordance with the remarks given in connection with the first embodiment. It should be particularly noted here that the number of ceramic layers to be formed on the metal substrate 4 is by no means limited to two as in the embodiment being discussed.

Besides the features already mentioned in connection with the composite substrate 2, the composite substrate 26 has the additional advantages that the ceramic layers 18 and 22 can be formed of materials that have characteristics suited to a specific object and that the mixed layer 20 ensures high adhesion between these ceramic layers 18 and 22. It is generally difficult to attain all of the desired characteristics by a single material but if two dissimilar ceramic layers 18 and 22 are formed as in the use of the composite substrate 26, their respective advantages can be combined in an effective way to attain the intended result. For instance, even if there is a great thermal expansion mismatch between the metal substrate 4 and the metal layer 12 or the device of interest, the occurrence of any unwanted phenomenon such as cracking can be effectively prevented by selecting ceramic layers 18 and 22 that have thermal expansion coefficients close to those of the metal substrate 4 and the metal layer 12 (or device), respectively.

FIG. 3 is a diagrammatic cross-sectional view of an application of the composite substrate shown in FIG. 1. In order to achieve even better heat dissipation, the metal substrate 4 is formed in the shape of a heat sink and the ceramic layer 8 is formed in a selected area of the substrate 4, with the metal layer 12 in a predetermined pattern being formed on the ceramic layer 8. It should, however, be remembered that this is just one example of the use of the present invention and that the composite substrate 2 or 26 can of course be employed extensively in various other applications.

An example of the process for producing the composite substrate 2 or 26 is hereunder described with reference to FIG. 4, which is a sketch of an apparatus that is used to implement the process of the present invention.

A metal substrate 4 of the type described hereinabove is attached to a holder 30 and placed in a vacuum chamber (not shown) which also contains an evaporation source 32 and an ion source 38, each being directed toward the metal substrate 4. It is preferable to polish and clean the surface of the metal substrate 4 before the operation is started. The evaporation source 32 may employ an electron beam to heat an evaporant 34 so that its vapor 36 is deposited on the metal substrate 4. The ion source 38 is preferably of the bucket type by which a supplied gas G is ionized to form a uniform ion beam 40 of a large area which is allowed to impinge on the metal substrate 4 so that it can be treated over a large surface area at a time. The thickness of the film being formed on the metal substrate 4 is checked with a monitor 42.

The choice of the evaporant 34 and the ion species in the beam 40 is made on the basis of the material of the ceramic layer (8,18,22) to be formed on the metal substrate 4, and useful combinations are as follows:

(1) When the ceramic layer is formed from cubic BN or BN containing cubic BN:

Boron (B) is selected as the evaporant 34 and nitrogen (N) ion as the ion in beam 40.

(2) When the ceramic layer is formed from AlN:

Aluminum (Al) is selected as the evaporant 34 and nitrogen ion as the ion in beam 40. If the metal substrate 4 is made of Al, only N ions may be injected into its surface in the initial stage of operation. In this case, the amount of injection of N ions may preferably range from about $1 \times 10^{16}$ to about $1 \times 10^{18}$ ions/cm$^2$. If this condition is met, sputtering is suppressed and yet AlN film having high resistivity can be formed.

(3) When the ceramic layer is formed from BP:

The evaporant 34 is boron and the ion in beam 40 is phosphorus (P) ion, or vice versa.

(4) When the ceramic layer is formed from diamond or diamond-like carbon:

The evaporant 34 is carbon (C) and the ion in beam 40 is at least one member selected from among carbon ions, hydrogen ions and ionized inert gases such as argon, the ion beam 40 optionally containing a silicon ion as a promoter of diamond formation.

The operation of film formation will proceed as follows: the vacuum chamber is evacuated to a pressure of, say, about $10^{-5}$–$10^{-7}$ Torr; then, in order to form a ceramic layer, the evaporant 34 in the evaporation source 32 is vaporized to produce a vapor 36 that is deposited on the metal substrate and simultaneously or alternately with this evaporative deposition, the ion beam 40 from the ion source 38 is allowed to impinge on the metal substrate 4; as a result, the mixed layer 6 is formed on the metal substrate 4 in the initial stage of this film formation, and the ceramic layer 8 is subsequently formed to produce a composite substrate that has the ceramic layer 8 and the underlying mixed layer 6 formed on the metal substrate 4 as shown in FIG. 1. If more than one cycle of evaporation and ion implantation is carried out with at least one of the evaporant 34 and the ion species in beam 40 being changed, a composite substrate can be produced that has the ceramic layer 22 and the underlying layers (20, 18, 16) formed on the substrate as shown in FIG. 2. The thickness of the ceramic layers being formed can be controlled to a desired value by using; for example, a thickness monitor 42.

The compositional ratio of vapor to ion (i.e., the ratio of the number of vapor particles to that of ion particles) may be determined for an appropriate value in accordance with the material of which the ceramic layer is to be formed.

The ion 40 is preferably accelerated by an energy of no higher than 40 keV. If a higher acceleration energy is employed, the sputtering action of the ion beam 40 is increased to potentially cause the following two problems: first, a film with a smooth surface cannot be attained; secondly, more damaged areas (e.g. defects) will form in the bulk of the ceramic layer to decrease the chance of the formation of a ceramic layer of good quality.

If desired, the ceramic layer may be formed while the surface of the metal substrate 4 is heated with a suitable heating means (not shown) to a temperature of up to about, say, 500° C. This is effective for the purpose of decreasing the development of damaged areas or the formation of cavities or voids due to injected ions. The reaction of film formation may sometimes be promoted by employing this method.

In the next step, using the evaporation source 32 and the ion source 38 described above, a metal vapor is deposited on the ceramic layer 8 or 22 and thereafter, or simultaneously therewith, an accelerated ionized inert gas is allowed to impinge on the ceramic layer 8 or 22. The evaporant 34 employed in this step is selected from among such metals as W, Mo, Ni, Cu, Al, Au, Ag and various alloys. The ion species in beam 40 is selected from among the ions of inert gases such as argon, xenon and nitrogen. As a result of this step, the metal layer 12 is formed on the ceramic layer 8 or 22 while the mixed layer 10 (or 24) is formed in an area near the interface between the metal layer 12 and the ceramic layer 8 (or 22), producing a composite substrate of the type indicated by 2 in FIG. 1 or by 26 in FIG. 2.

The metal layer 12 is preferably deposited in a thickness that is approximate to the range (i.e., mean projective range) of the ions in beam 40 being injected. By selecting this value, the mixing layer 10 (or 24) can be effectively formed right in an area near the interface between the metal layer 12 and the ceramic layer 8 (or 22). After the formation of the mixed layer 10 or 24, further vapor deposition may be performed in order to increase the thickness of the metal layer 12.

The ion 40 is preferably accelerated by an energy of no higher than about 40 keV. If a higher acceleration energy is employed, the sputtering action of the ion beam 40 is increased to decrease the possibility of forming a smooth-surfaced film.

The mixing layer 10 or 24 may be formed while the surface of the ceramic layer 8 or 22 is heated with a suitable heating means (not shown) to a temperature of up to about 400°. This method enables the mixed layer 10 or 24 to be formed in an efficient manner while good interdiffusion is ensured between the metal layer 12 and the ceramic layer 8 or 22.

The above-described process of the present invention for producing a composite substrate has the following features.

(1) The use of comparatively low temperatures (below several hundred degrees) of treatment permits films of good quality to be formed without causing any undue thermal distortion or cracking.

(2) A ceramic layer having low impurity levels and uniform quality and thickness can be attained, and this leads to the production of a composite substrate having improved electrical insulation and heat conduction.

(3) A very thin ceramic layer can be formed, which also contributes to the production of a highly heat-conductive composite substrate.

(4) The mixed layer allows the ceramic layer to adhere strongly to the metal layer and the resulting composite substrate is highly reliable in that the individual constituent layers will not easily separate from one another.

(5) The composite substrate produced by this process has a high degree of surface smoothness and ensures good adhesion and heat conduction to chips and other devices to be mounted on the substrate.

(6) The process allows treatment of a large surface area in one operation and thereby provides for mass production of composite substrates at low costs.

As will be understood from the foregoing description, the present invention provides a highly economical composite substrate that has good characteristics such as high electrical insulation, heat conductivity and reliability and the topmost metal layer of which adheres strongly to an underlying layer and will not easily separate from the latter.

What is claimed is:

1. A process for producing a composite substrate for electronic devices such as integrated circuits and semiconductors, comprising:
   a first step wherein, initially, a vaporized material is deposited, and an accelerated ion beam is allowed to impinge on a metal substrate in a vacuum environment and, thereafter, said vaporized material is continued to be deposited thereon so as to form an electrically insulating ceramic layer on said metal substrate and a mixed layer in an area near the interface between said metal substrate and said ceramic layer, said mixed layer being composed of the metal and ceramic materials of the layers situated on both sides thereof; and
   a second step wherein, initially, a metal vapor is deposited, and an accelerated ionized inert gas is simultaneously allowed to impinge on the ceramic layer formed in the first step and, thereafter, said metal vapor alone is continued to be deposited thereon so as to form a metal layer on said ceramic layer and a mixed layer in an area near the interface between said ceramic layer and said metal layer, said mixed layer being composed of the ceramic and metal materials of the layers situated on both sides thereof.

2. A process according to claim 1 wherein said vaporized material is comprised of at least one material selected from a group consisting of B, Al, P and C, said accelerated ion beam is comprised of at least one material selected from a group consisting of N ion, P ion, B ion, C ion and an ionized inert gas, and said ceramic layer is comprised of at least one material selected from a group consisting of cubic BN, BN containing cubic BN, AlN, BP diamond, and diamond-like carbon.

3. The process according to claim 1 wherein in said first step, said vaporized material is deposited and said accelerated ion beam is allowed to impinge on said metal substrate simultaneously.

4. The process according to claim 1 wherein in said first step, said vaporized material is deposited and said accelerated ion beam is allowed to impinge on said metal substrate alternately.

5. The process of claim 1, wherein said ion is accelerated by an energy of no higher than 40 keV.

6. A process for producing a composite substrate for electronic devices such as integrated circuits and semiconductors comprising:
   a first step wherein more than one cycle of initial deposition of a vaporized material and implantation of an accelerated ion beam on a metal substrate in a vacuum environment and subsequent continued deposition of said vaporized material thereon is carried out with at least one of an evaporant and an ion species in said ion beam being changed, so as to form a plurality of electrically insulating dissimilar ceramic layers on said metal substrate, a first mixed layer being formed in an area near an interface between said metal substrate and an overlying ceramic layer, and a second mixed layer being formed in an area near an interface between any two adjacent ceramic layers, each of said mixed layers being composed of materials constituting each of the layers situated on both sides thereof; and
   a second step wherein, initially, a metal vapor is deposited, and an accelerated ionized inert gas is simultaneously allowed to impinge on the topmost ceramic layer formed in said first step and, thereafter, said metal vapor alone is continued to be deposited thereon, so as to form a metal layer on said topmost ceramic layer and a mixed layer in an area near an interface between said topmost ceramic layer and said metal layer, said mixed layer being composed of ceramic and metal materials of the layers situated on both sides thereof.

7. A process according to claim 6 wherein said vaporized material is comprised of at least one material selected from a group consisting of B, Al, P and C, said accelerated ion beam is comprised of at least one material selected from a group consisting of N ion, P ion, B ion, C ion and an ionized inert gas, and each of said ceramic layers is comprised of at least one material selected from a group consisting of cubic BN, BN containing cubic BN, AlN, BP diamond, and diamond-like carbon.

8. The process according to claim 6 wherein in said first step, initially, said vaporized material is deposited and said accelerated ion beam is allowed to impinge on said metal substrate simultaneously.

9. The process according to claim 6 wherein in said first step, said vaporized material is deposited and said accelerated ion beam is allowed to impinge on said metal substrate alternately.

10. The process of claim 6, wherein said ion is accelerated by an energy of no higher than 40 keV.

* * * * *